United States Patent
Liu et al.

(10) Patent No.: US 9,425,276 B2
(45) Date of Patent: Aug. 23, 2016

(54) HIGH ELECTRON MOBILITY TRANSISTORS

(71) Applicant: Taiwan Semiconductor Manufacturing Co., Ltd., Hsin-Chu (TW)

(72) Inventors: Po-Chun Liu, Hsinchu (TW); Chung-Yi Yu, Hsin-Chu (TW); Chi-Ming Chen, Zhubei (TW); Chen-Hao Chiang, Jhongli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 74 days.

(21) Appl. No.: 13/745,925

(22) Filed: Jan. 21, 2013

(65) Prior Publication Data
US 2014/0203289 A1    Jul. 24, 2014

(51) Int. Cl.
| | |
|---|---|
| H01L 29/15 | (2006.01) |
| H01L 31/0256 | (2006.01) |
| H01L 29/66 | (2006.01) |
| H01L 21/338 | (2006.01) |
| H01L 29/43 | (2006.01) |
| H01L 29/778 | (2006.01) |
| H01L 29/20 | (2006.01) |
| H01L 29/201 | (2006.01) |

(52) U.S. Cl.
CPC ........ *H01L 29/432* (2013.01); *H01L 29/66462* (2013.01); *H01L 29/7783* (2013.01); *H01L 29/7787* (2013.01); *H01L 29/201* (2013.01); *H01L 29/2003* (2013.01)

(58) Field of Classification Search
CPC ............ H01L 29/432; H01L 29/66462; H01L 29/7783; H01L 29/201; H01L 29/2003; H01L 29/7787
USPC ............ 257/194, 76, 201, E29.253, E21.407, 257/E29.246; 438/167
See application file for complete search history.

(56) References Cited

U.S. PATENT DOCUMENTS

| | | | | |
|---|---|---|---|---|
| 6,064,082 A | * | 5/2000 | Kawai | H01L 29/7783 257/191 |
| 8,436,398 B2 | | 5/2013 | Lidow et al. | |
| 2002/0167023 A1 | * | 11/2002 | Chavarkar et al. | 257/194 |

(Continued)

FOREIGN PATENT DOCUMENTS

| | | |
|---|---|---|
| CN | 102365745 A | 2/2012 |
| CN | 102881715 A | 1/2013 |

*Primary Examiner* — Fernando L Toledo
*Assistant Examiner* — Aaron Gray
(74) *Attorney, Agent, or Firm* — Eschweiler & Associates, LLC

(57) ABSTRACT

The present disclosure relates to a donor layer of bi-layer AlGaN and associated method of fabrication within a high electron mobility transistor (HEMT) configured to provide low-resistance ohmic source and drain contacts to reduce power consumption, while maintaining a high-mobility of a two-dimensional electron gas (2DEG) within a channel of the HEMT. The donor layer of bi-layer AlGaN comprises a mobility-enhancing layer of $Al_zGa_{(1-z)}N$, a resistance-reducing layer of $Al_xGa_{(1-x)}N$ disposed over the mobility-enhancing layer, wherein the ohmic source and drain contacts connect to the HEMT. A channel layer of GaN is disposed beneath the mobility-enhancing layer, wherein a 2DEG resides, forming the channel of the HEMT.

20 Claims, 13 Drawing Sheets

(56) References Cited

U.S. PATENT DOCUMENTS

2003/0218183 A1* 11/2003 Micovic et al. ............... 257/192
2007/0045670 A1* 3/2007 Kuraguchi .................... 257/249
2012/0126287 A1* 5/2012 Aoki ............................. 257/192

* cited by examiner

300A

300B

300C

HIGH ELECTRON MOBILITY TRANSISTORS

BACKGROUND

High electron mobility transistors (HEMTs) are utilized in integrated circuits for high-frequency applications due to their high efficiency relative to other power semiconductor devices such as insulated gate bipolar transistors and thyristors. HEMTs utilize a heterojunction between two semiconducting materials with different band gaps to form a device channel, instead of a doped region as in a metal oxide semiconductor field-effect transistor (MOSFET). Two exemplary materials used to form the heterojunction within a HEMT are a doped wide-bandgap n-type donor layer of AlGaN coupled to an un-doped narrow-bandgap channel layer of GaN. Ohmic contacts formed to the AlGaN donor layer are subject to increased contact resistance as the Al concentration of the AlGaN donor is increased. Conversely, reducing the concentration of the AlGaN donor layer improves the contact resistance, but degrades electron mobility within the channel.

DETAILED DESCRIPTION

Figure 1A:
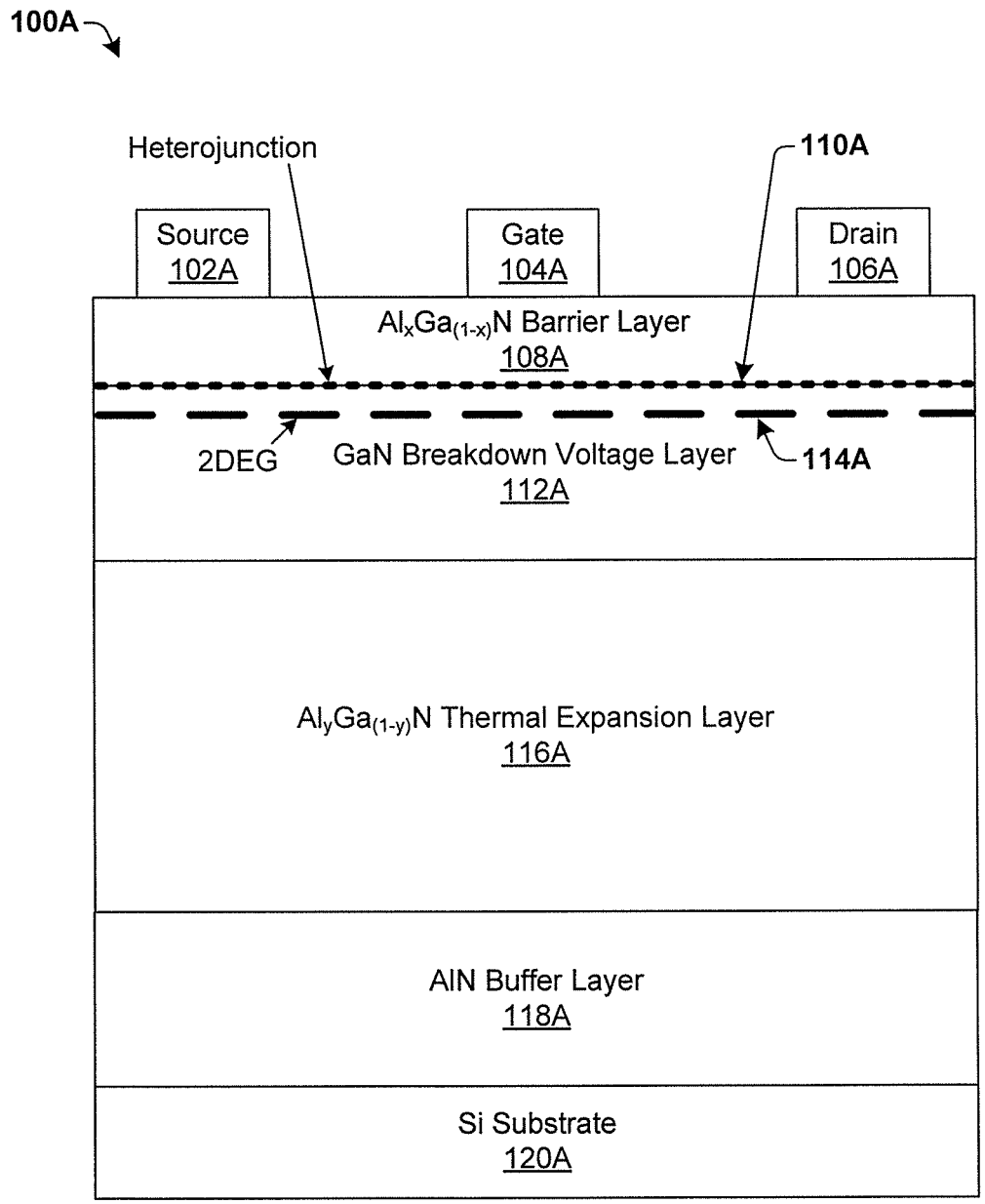
FIG. 1A illustrates a cross-sectional view of a transistor comprising a donor layer of $Al_xGa_{(1-x)}N$.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1A illustrates a cross-sectional view of a transistor 100A comprising a donor layer 108A of $Al_xGa_{(1-x)}N$ formed beneath a source contact 102A, a gate 104A, and a drain contact 106A. A heterojunction 110A is formed between the donor layer 108A and a channel layer 112A of GaN. Electrons generated from the donor layer 108A diffuse into the GaN channel layer 112A to form a high-mobility/high-concentration two-dimensional electron gas (2DEG) 114A, which forms a channel of the device within the channel layer 112A in a vicinity of the heterojunction 110A. A thermal expansion layer 116A of $Al_xGa_{(1-y)}N$ is disposed beneath the channel layer 112A, and an buffer layer 118A of AlN is disposed beneath the channel layer 112A and above a Si substrate 120A.

In at least one embodiment, the transistor 100A includes the channel layer 112A and the donor layer 108A having compounds made from the III-V groups in the periodic table of elements. However, the channel layer 112A and the donor layer 108A are different from each other in composition. The channel layer 112A is undoped or unintentionally doped (UID). The donor layer 108A is intentionally doped.

Figure 1B:
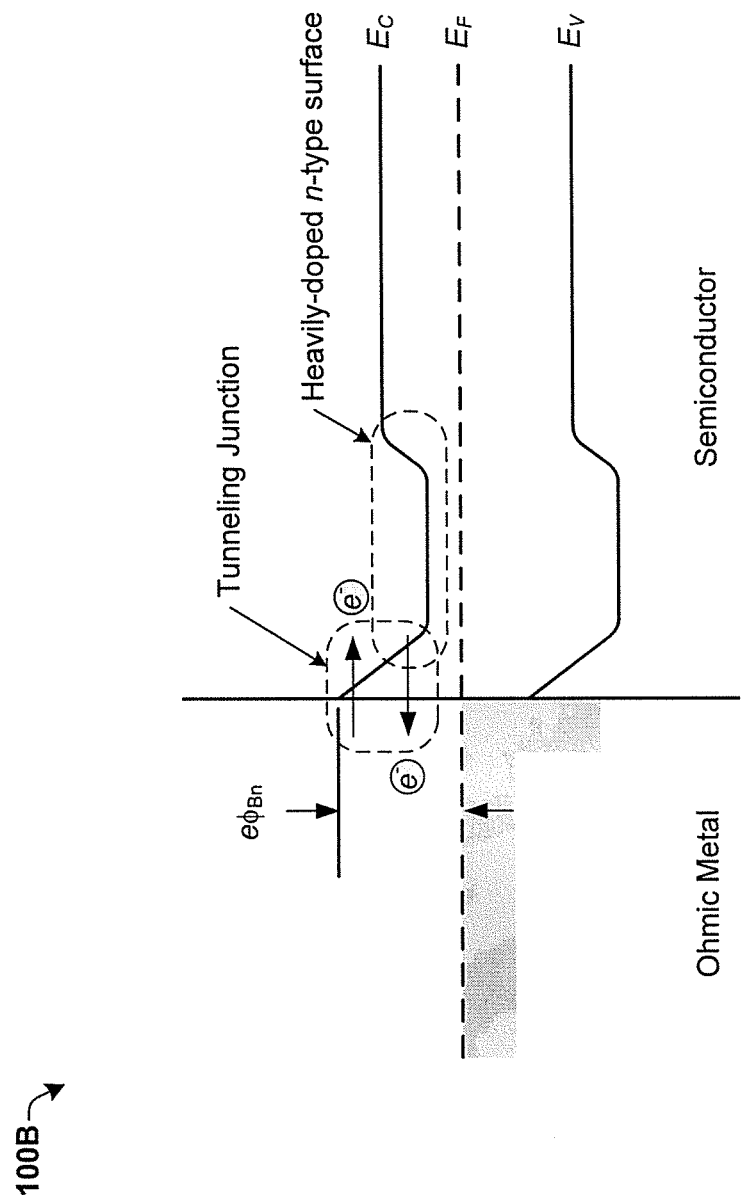
FIG. 1B illustrates an electron band structure of a heterojunction formed between an ohmic metal and a donor layer of $Al_xGa_{(1-x)}N$.

FIG. 1B illustrates an electron band structure 100B of a heterojunction formed between an ohmic metal and a semiconducting material comprising the donor layer 108A of $Al_xGa_{(1-x)}N$ of FIG. 1A. The semiconducting material comprises a bandgap of approximately equal to an energy of a conduction band $E_C$ minus the energy of a valence band $E_V$ of the semiconducting material (i.e., $E_C$-$E_V$), and is heavily doped with an n-type material near the surface, which lowers the energy of the conduction band $E_C$ relative to the Fermi level $E_F$, thus freeing electrons to tunnel from the ohmic metal to the conduction band $E_C$ of the semiconducting material. This influx of electrons to the conduction band $E_C$ of the semiconducting material, increasing electron concentration and overall electron mobility within the channel of the heterojunction.

The donor layer 108A of $Al_xGa_{(1-x)}N$ exhibits poor ohmic contact behavior resulting in an increased contact resistance for Al concentrations above approximately 25% (i.e., molar fraction x>0.25), which is induced by a large band gap of the donor layer 108A of $Al_xGa_{(1-x)}N$, and an alloy process for disposal of the source contact 102A and drain contact 106A over the donor layer 108A of $Al_xGa_{(1-x)}N$. Reducing the Al concentration below approximately 15% (i.e., molar fraction x<0.15) can improve the ohmic contact behavior by lowering the resistance, but degrades electron mobility within the 2DEG 114A.

Accordingly, the present disclosure relates to a donor layer of bi-layer AlGaN within a HEMT configured to provide low-resistance ohmic source and drain contacts to reduce power consumption, while maintaining a high-mobility of a 2DEG within a channel of the HEMT. The donor layer of bi-layer AlGaN comprises a mobility-enhancing layer of $Al_zGa_{(1-z)}N$, and a resistance-reducing layer of $Al_xGa_{(1-x)}N$ disposed over the mobility-enhancing layer, wherein the ohmic source and drain contacts connect to the HEMT. A channel layer is disposed beneath the mobility-enhancing layer, wherein a 2DEG resides, forming the channel of the HEMT.

Figure 2A:
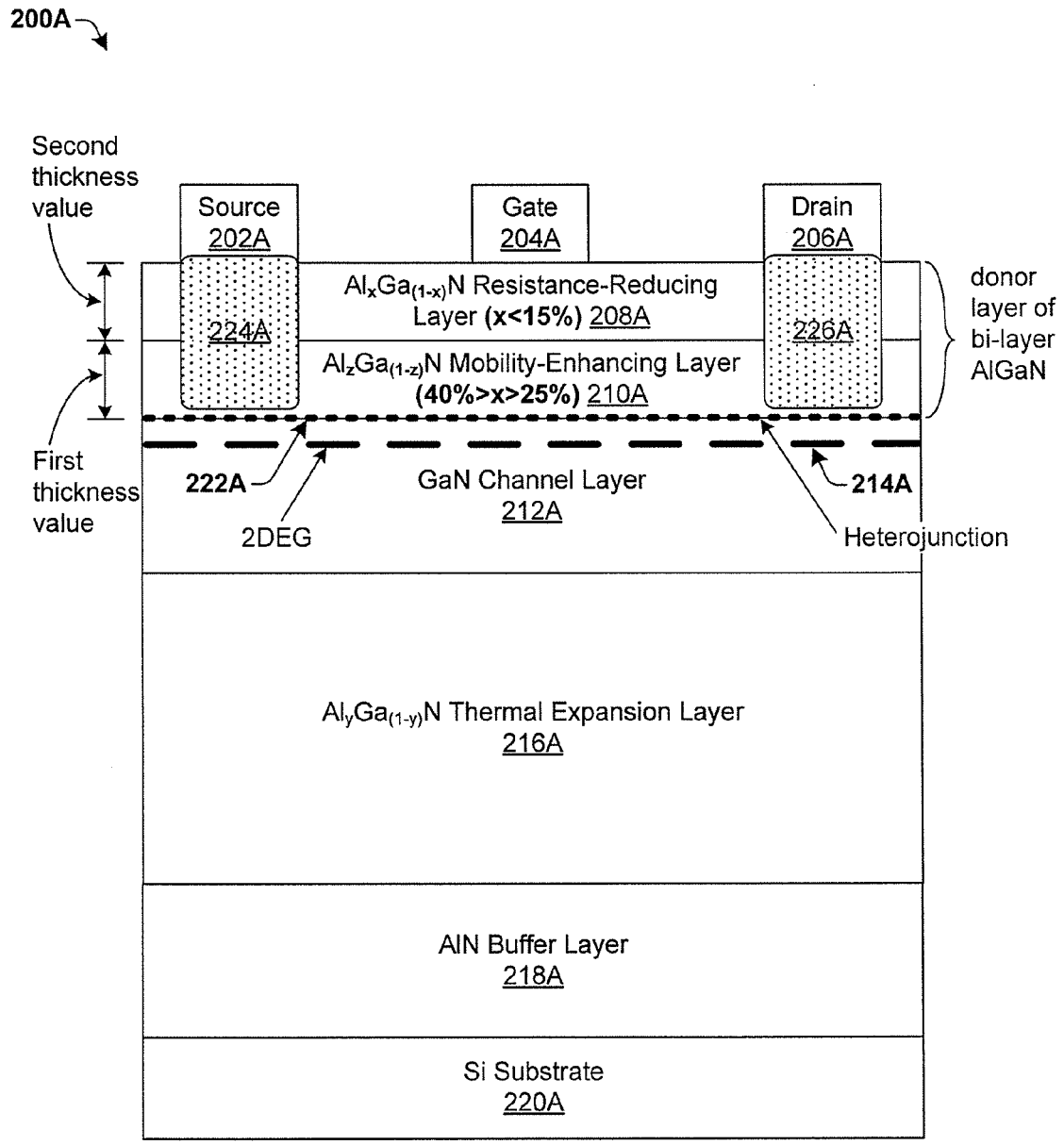
FIG. 2A illustrates a cross-sectional view of some embodiments of a transistor comprising a donor layer of bi-layer AlGaN further comprising a mobility-enhancing layer of $Al_zGa_{(1-z)}N$, and a resistance-reducing layer of $Al_xGa_{(1-x)}N$.

FIG. 2A illustrates a cross-sectional view of some embodiments of a transistor 200A comprising a donor layer of bi-layer AlGaN further comprising a mobility-enhancing layer 210A of $Al_zGa_{(1-z)}N$, wherein a third molar fraction z is less than approximately 0.4 and greater than approximately 0.25, and a resistance-reducing layer 208A of $Al_xGa_{(1-x)}N$ disposed over the mobility-enhancing layer 210A, wherein a first molar fraction x is less than approximately 0.15 and greater than approximately 0.1. The a donor layer of bi-layer AlGaN is formed beneath a source ohmic metal contact 202A connecting to the resistance-reducing layer 208A disposed over a source region 224A, a gate material 204A disposed above a channel region and connecting to the resistance-reducing layer 208A, and a drain ohmic metal contact 206A connecting to the resistance-reducing layer 208A disposed over a drain region 226A. In some embodiments, the source ohmic metal contact 202A and drain ohmic metal contact 206A comprise Ti/Al/Ti or Ti/Al/Ti/TiN, and the gate material 204A comprises TiN or WN. A heterojunction 222A is formed between the donor layer of bi-layer AlGaN and a channel layer 212A of GaN, wherein a 2DEG 214A resides, comprising a high-mobility channel of the transistor 200A.

The transistor 200A further comprises a HEMT, wherein the mobility-enhancing layer 210A comprises a first thickness value that is approximately twice a second thickness value of the resistance-reducing layer 208A. In some embodiments, the first thickness value is between approximately 20 nanometers and 40 nanometers, and the second thickness value is between approximately 10 nanometers and 20 nanometers. A thermal expansion layer 216A of $Al_yGa_{(1-y)}N$ is disposed beneath the channel layer 212A, wherein a second molar fraction y is less than approximately 1 and greater than approximately 0. A buffer layer 218A of AlN is disposed beneath the thermal expansion layer 216A, and above a Si substrate 220A.

Figure 2B:
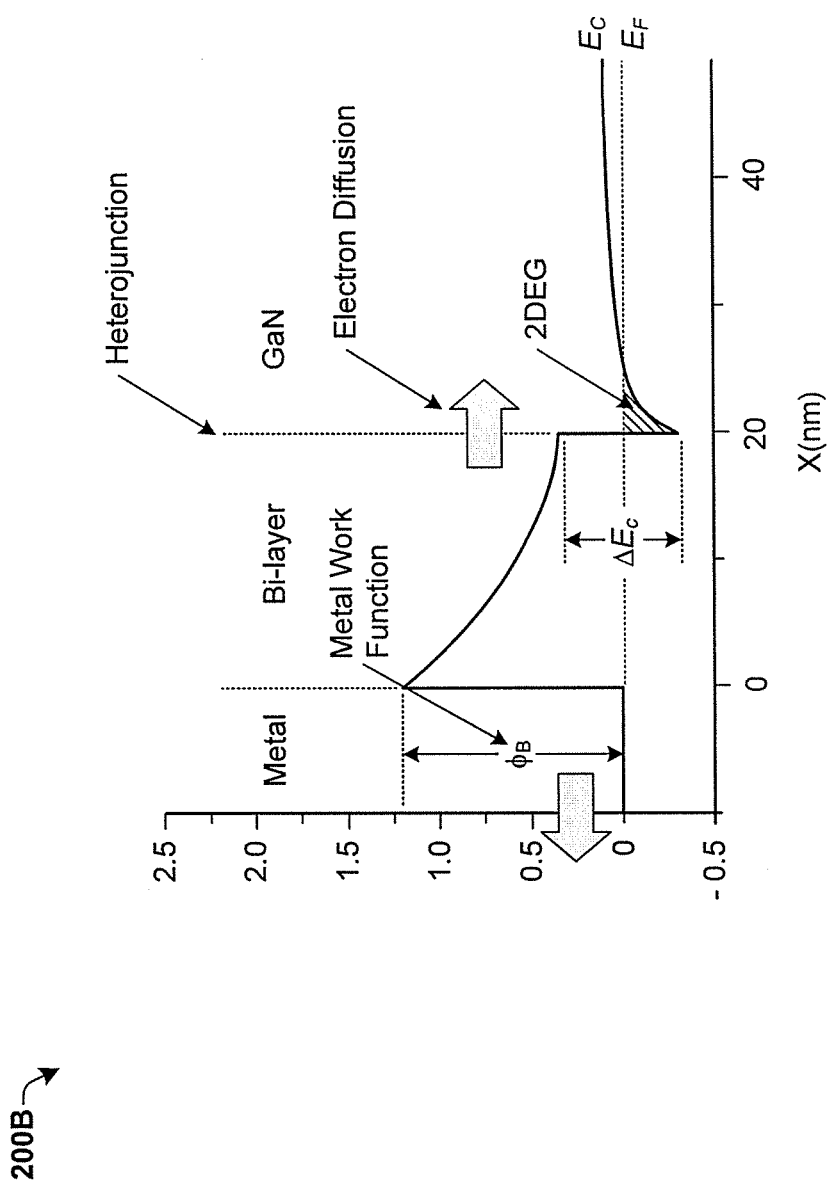
FIG. 2B illustrates some embodiments of an electron band structure of a heterojunction formed between a donor layer of bi-layer AlGaN and a channel layer of GaN.

FIG. 2B illustrates some embodiments of an electron band structure 200B of a heterojunction formed between the donor layer of bi-layer AlGaN of FIG. 2A and the channel layer 212A of GaN of FIG. 2A. Within the donor layer of bi-layer AlGaN, a concentration gradient between the mobility-enhancing layer of $Al_zGa_{(1-z)}N$ (0.4>z>0.25) and the resistance-reducing layer of $Al_xGa_{(1-x)}N$ (0.15>x>0.1) produces a conduction band ($E_C$) characteristic, wherein the energy of the conduction band decreases away from the ohmic metal and towards the channel layer of GaN. As a result, conduction electrons within the donor layer of bi-layer AlGaN diffuse into the channel layer 212A of GaN due to the conduction band ($E_C$) characteristic (e.g., electrons move to the lowest energy state). The electrons accumulate at a potential minimum of the conduction band ($E_C$), which dips below the Fermi level ($E_F$) at the heterojunction, trapping the electrons to form the 2DEG.

Figure 3A:
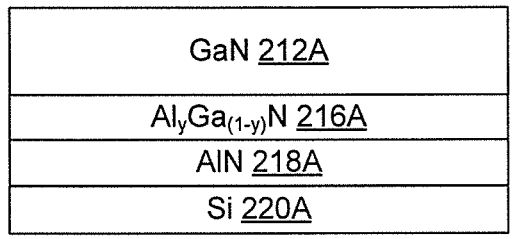
FIGS. 3A-3O illustrate cross-sectional views of some embodiments of a donor layer of bi-layer AlGaN fabrication within a transistor.
Figure 3B:
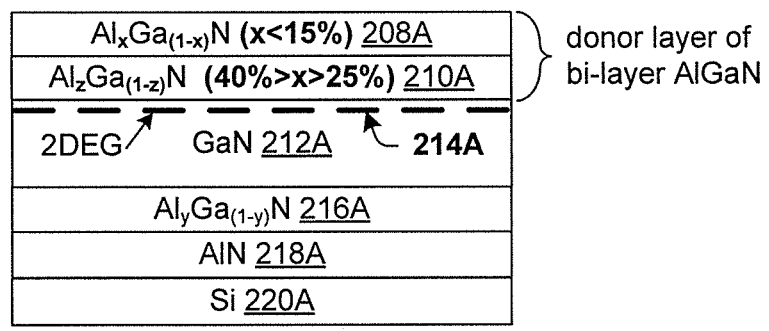
Figure 3C:
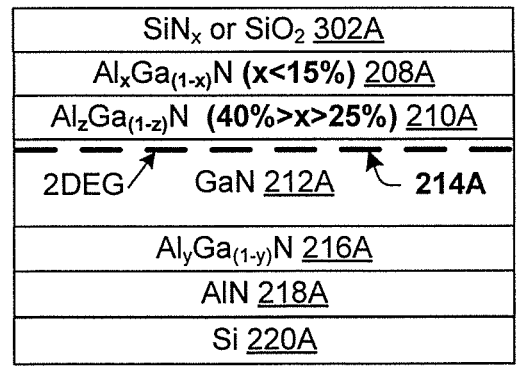
Figure 3D:
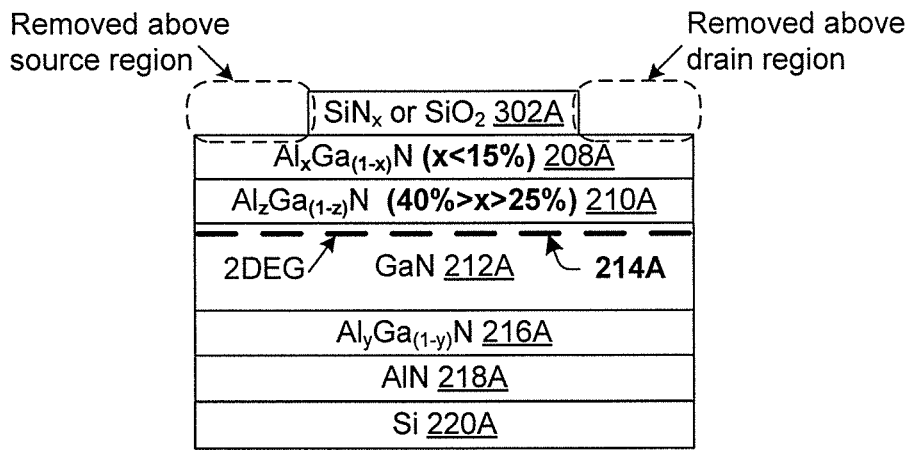
Figure 3E:
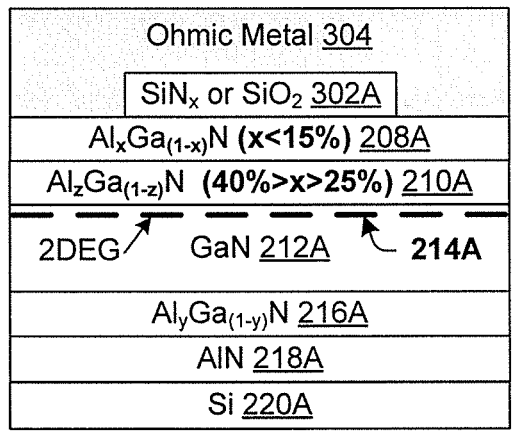
Figure 3F:
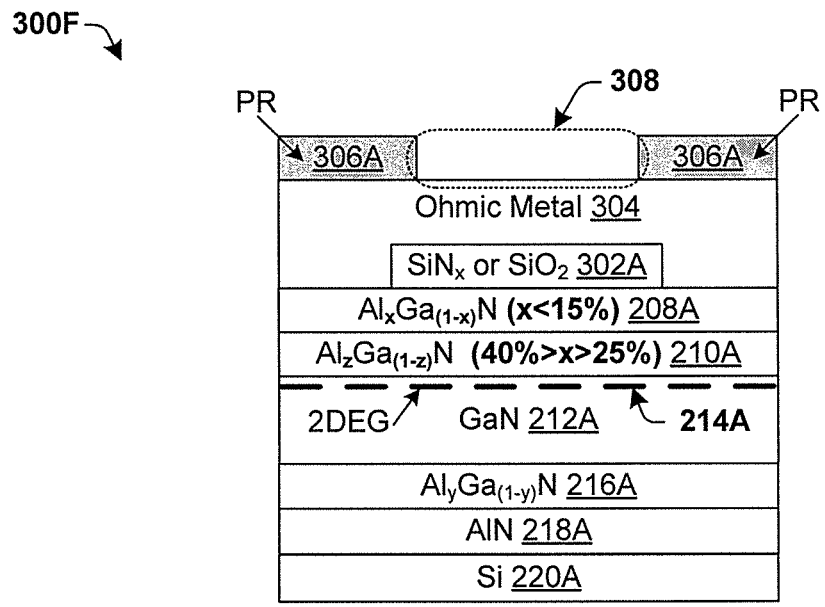
Figure 3G:
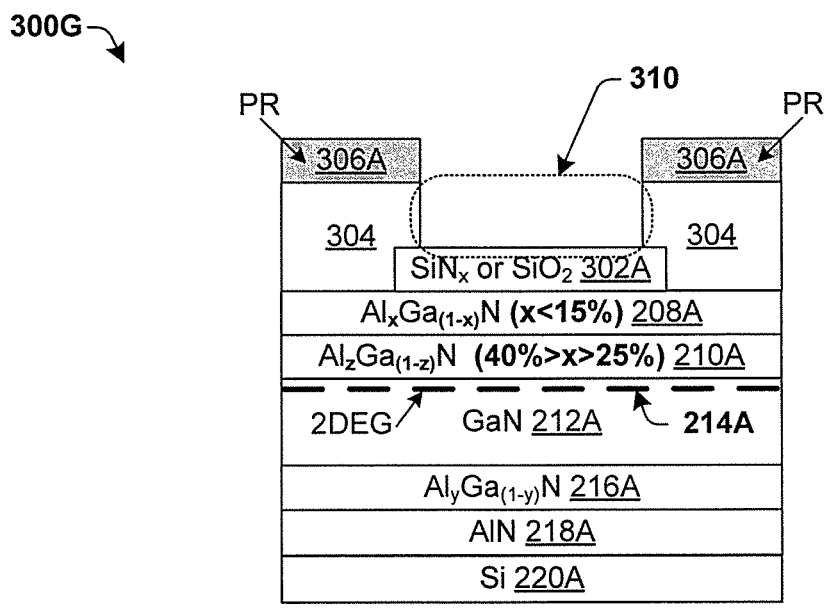
Figure 3H:
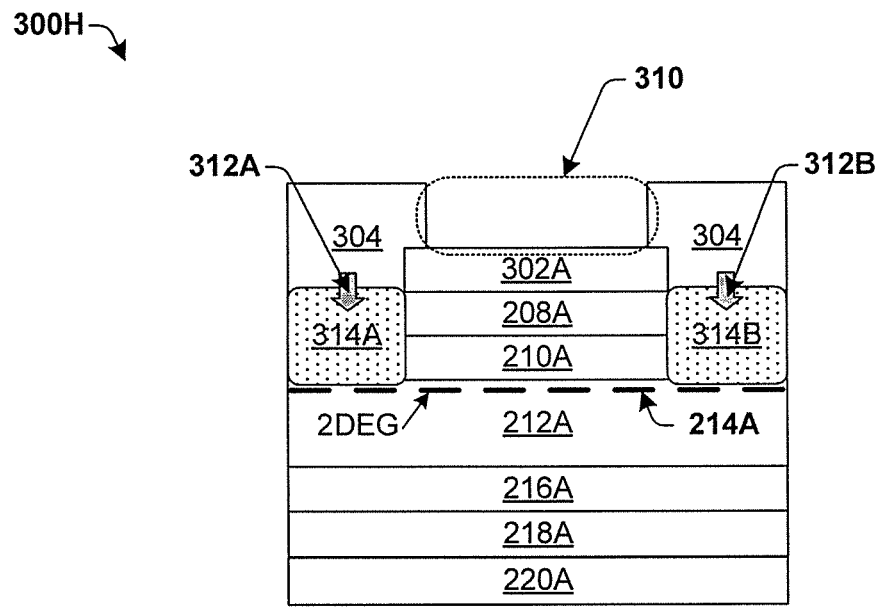
Figure 3I:
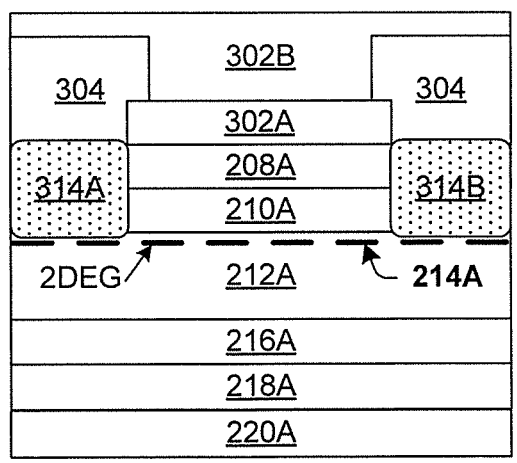
Figure 3J:
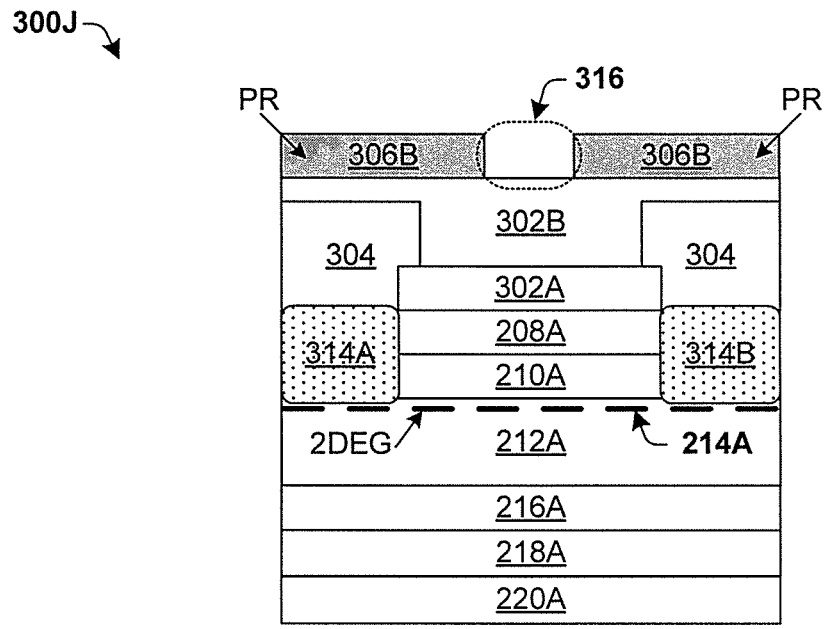
Figure 3K:
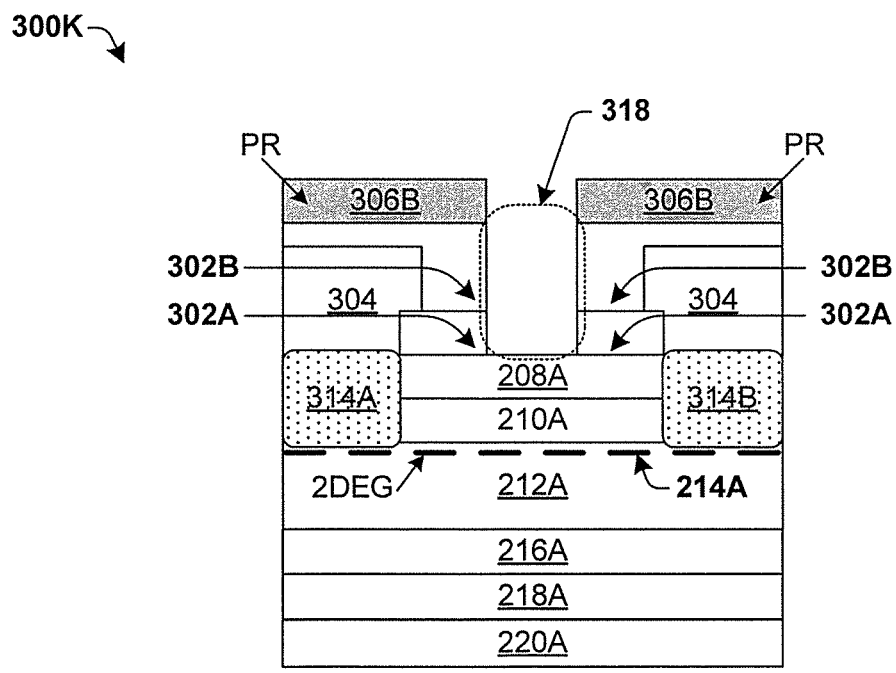
Figure 3L:
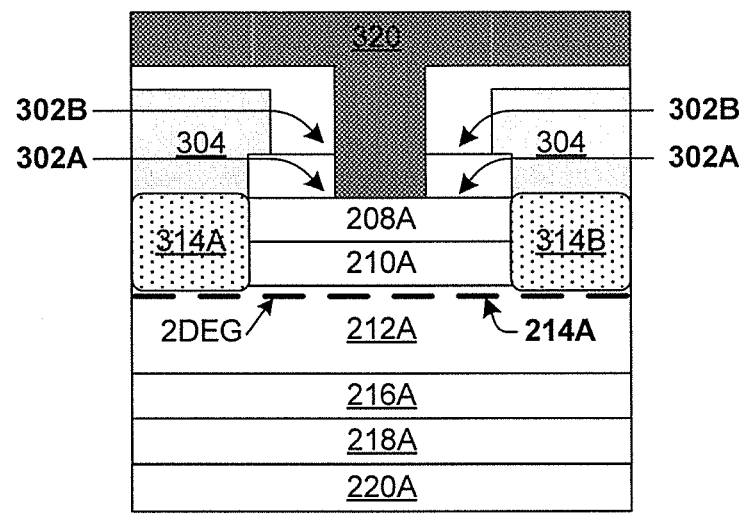
Figure 3M:
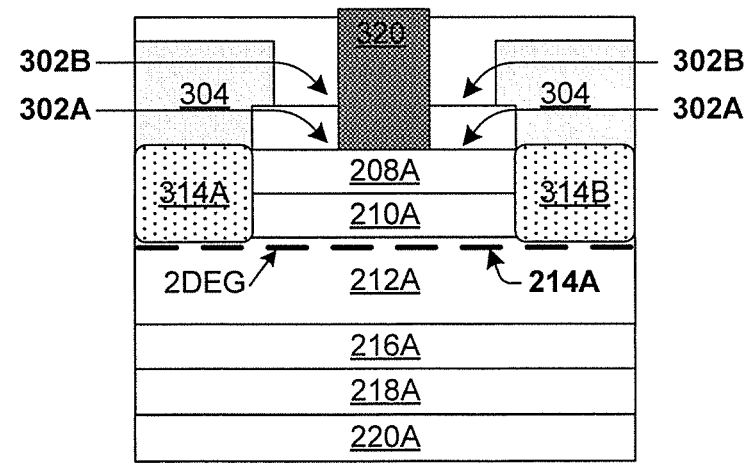
Figure 3N:
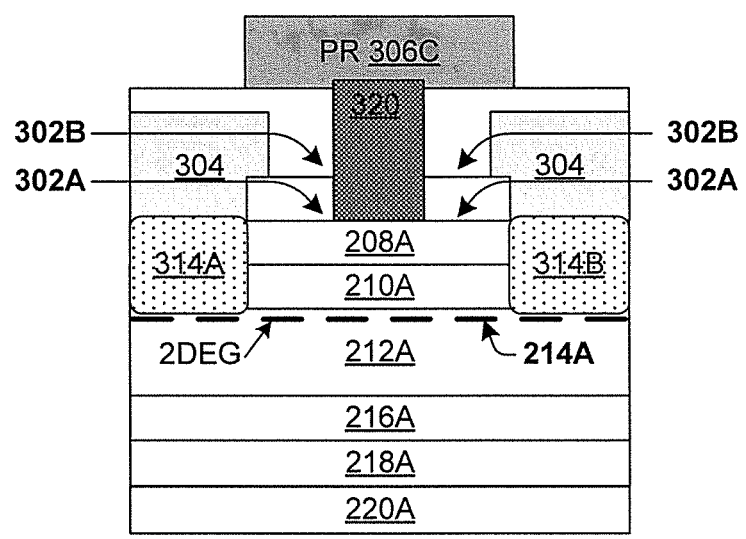
Figure 3O:
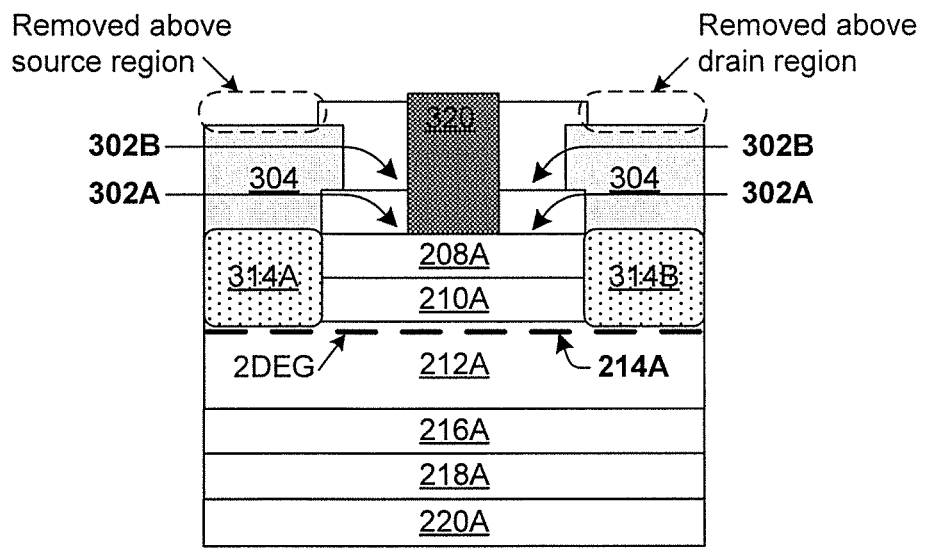

FIGS. 3A-3O illustrate cross-sectional views of some embodiments of a donor layer of bi-layer AlGaN fabrication within a transistor. FIG. 3A illustrates a semiconductor workpiece 300A comprising a Si substrate 220A, a buffer layer 218A of AlN configured to lattice match the Si substrate 220A, a thermal expansion layer 216A of $Al_yGa_{(1-y)}N$ configured with a low coefficient of thermal expansion to achieve structural stability across a range of temperatures, and a channel layer 212A of GaN configured to shield the aforementioned layers from damage due to biasing of a gate (not yet shown). FIG. 3B illustrates a semiconductor workpiece 300B comprising the semiconductor workpiece 300A of FIG. 3A, wherein a donor layer of bi-layer AlGaN has been added. The donor layer of bi-layer AlGaN comprises a mobility-enhancing layer 210A of $Al_zGa_{(1-z)}N$ disposed over the channel layer 212A, wherein a third molar fraction z is less than approximately 0.4 and greater than approximately 0.25, and a resistance-reducing layer 208A of $Al_xGa_{(1-x)}N$ disposed over the mobility-enhancing layer 210A, wherein a first molar fraction x is less than approximately 0.15 and greater than approximately 0.1. FIG. 3C illustrates a semiconductor workpiece 300C comprising the semiconductor workpiece 300B of FIG. 3B, wherein a first isolation layer 302A has been added above the resistance-reducing layer 208A. The first isolation layer 302A comprises $SiN_x$ or $SiO_2$, wherein x is the first molar fraction. FIG. 3D illustrates a semiconductor workpiece 300D comprising the semiconductor workpiece 300C of FIG. 3C, wherein portions of the first isolation layer 302A have been removed above a source region and a drain region. FIG. 3E illustrates a semiconductor workpiece 300E comprising the semiconductor workpiece 300D of FIG. 3D, wherein an ohmic metallization layer 304 has been added above the first isolation layer 302A, source region, and drain region.

FIG. 3F illustrates a semiconductor workpiece 300F comprising the semiconductor workpiece 300E of FIG. 3E, wherein a first layer of photoresist 306A has been disposed above the ohmic metallization layer 304, exposed, and developed through optical lithography to create an first opening 308 in the first layer of photoresist 306A. FIG. 3G illustrates a semiconductor workpiece 300G comprising the semiconductor workpiece 300F of FIG. 3F, wherein the ohmic metallization layer 304 has been etched away beneath the first opening 308 to create a first recess 310 within the ohmic metallization layer 304. FIG. 3H illustrates a semiconductor workpiece 300H comprising the semiconductor workpiece 300G of FIG. 3G, wherein electrons tunnel from the ohmic metallization layer 304 into the $Al_xGa_{(1-x)}N/Al_zGa_{(1-z)}N$ donor bi-layer through a source tunneling junction 312A between the ohmic metallization layer 304 and a source region 314A, and a drain tunneling junction 312B between the ohmic metallization layer 304 and a drain region 314B. Electrons within the $Al_xGa_{(1-x)}N/Al_zGa_{(1-z)}N$ donor bi-layer also diffuse into the channel layer 212A, and accumulate to form the 2DEG 214A. FIG. 3I illustrates a semiconductor workpiece 300I comprising the semiconductor workpiece 300H of FIG. 3H, wherein a second isolation layer 302B been added above the first isolation layer 302A and the ohmic metallization layer 304. The second isolation layer 302B also comprises $SiN_x$ or $SiO_2$, wherein x is the first molar fraction.

FIG. 3J illustrates a semiconductor workpiece 300J comprising the semiconductor workpiece 300I of FIG. 3I, wherein a second layer of photoresist 306B has been disposed above the second isolation layer 302B, exposed, and developed through optical lithography to create an second opening 316 in the second layer of photoresist 306B. FIG. 3K illustrates a semiconductor workpiece 300K comprising the semiconductor workpiece 300J of FIG. 3J, wherein portions of the second isolation layer 302B and the first isolation layer 302A have been etched away beneath the second opening 316 to create a second recess 318 over the channel region. FIG. 3L illustrates a semiconductor workpiece 300L comprising the semiconductor workpiece 300K of FIG. 3K, wherein the second recess 318 has been filled with a gate material 320 which extends over a surface of the second isolation layer 302B. FIG. 3M illustrates a semiconductor workpiece 300M comprising the semiconductor workpiece 300L of FIG. 3L, wherein the gate material 320 over the surface of the second isolation layer 302B has been removed.

FIG. 3N illustrates a semiconductor workpiece 300N comprising the semiconductor workpiece 300M of FIG. 3M, wherein a third layer of photoresist 306C has been disposed, exposed, and developed through optical lithography to remove the third layer of photoresist 306C above the source region 314A and a drain region 314B. FIG. 3O illustrates a semiconductor workpiece 300O comprising the semiconductor workpiece 300N of FIG. 3N, wherein portions of the second isolation layer 302B have been etched away above the source region 314A and a drain region 314B to allow for a contact to the source region 314A and a drain region 314B through the ohmic metallization layer 304, resulting in a HEMT transistor.

Figure 4:
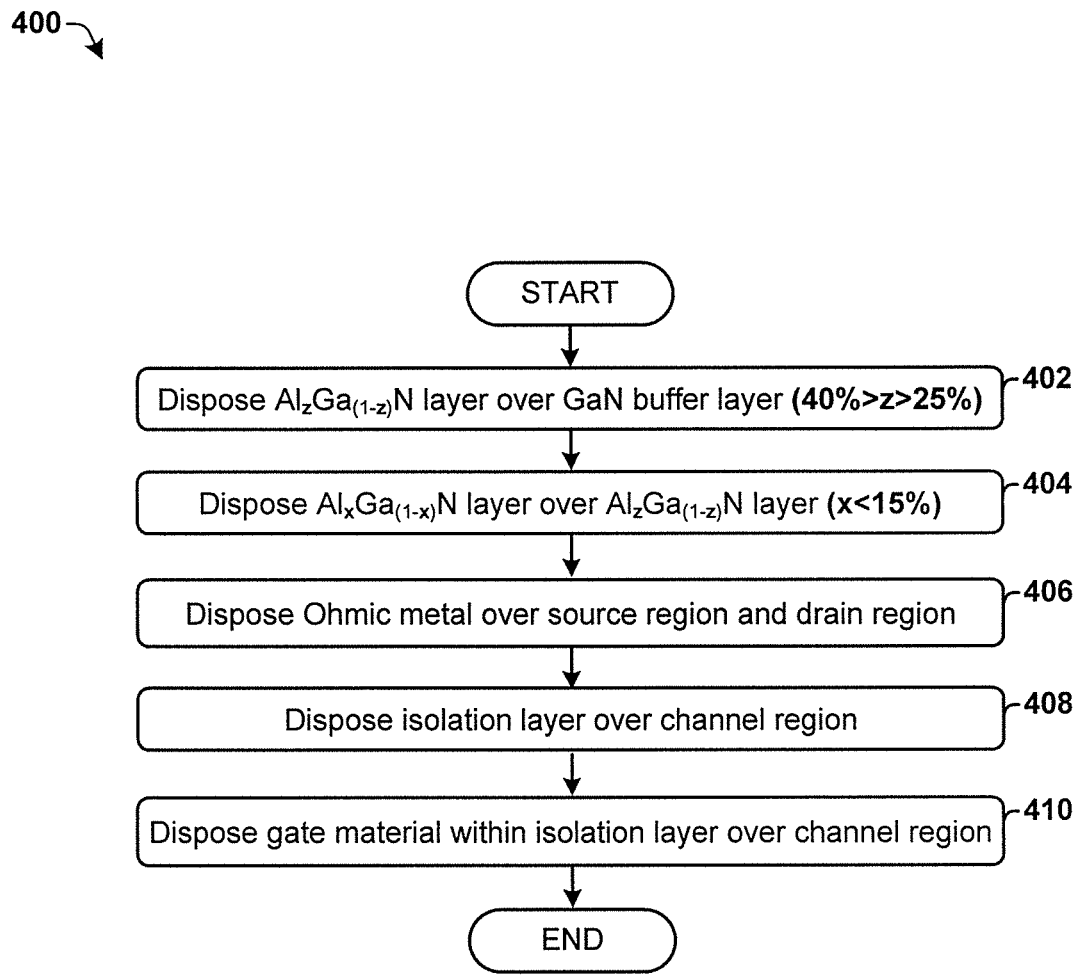
FIG. 4 illustrates some embodiments of a method to form a donor layer of bi-layer AlGaN.
Figure 5:
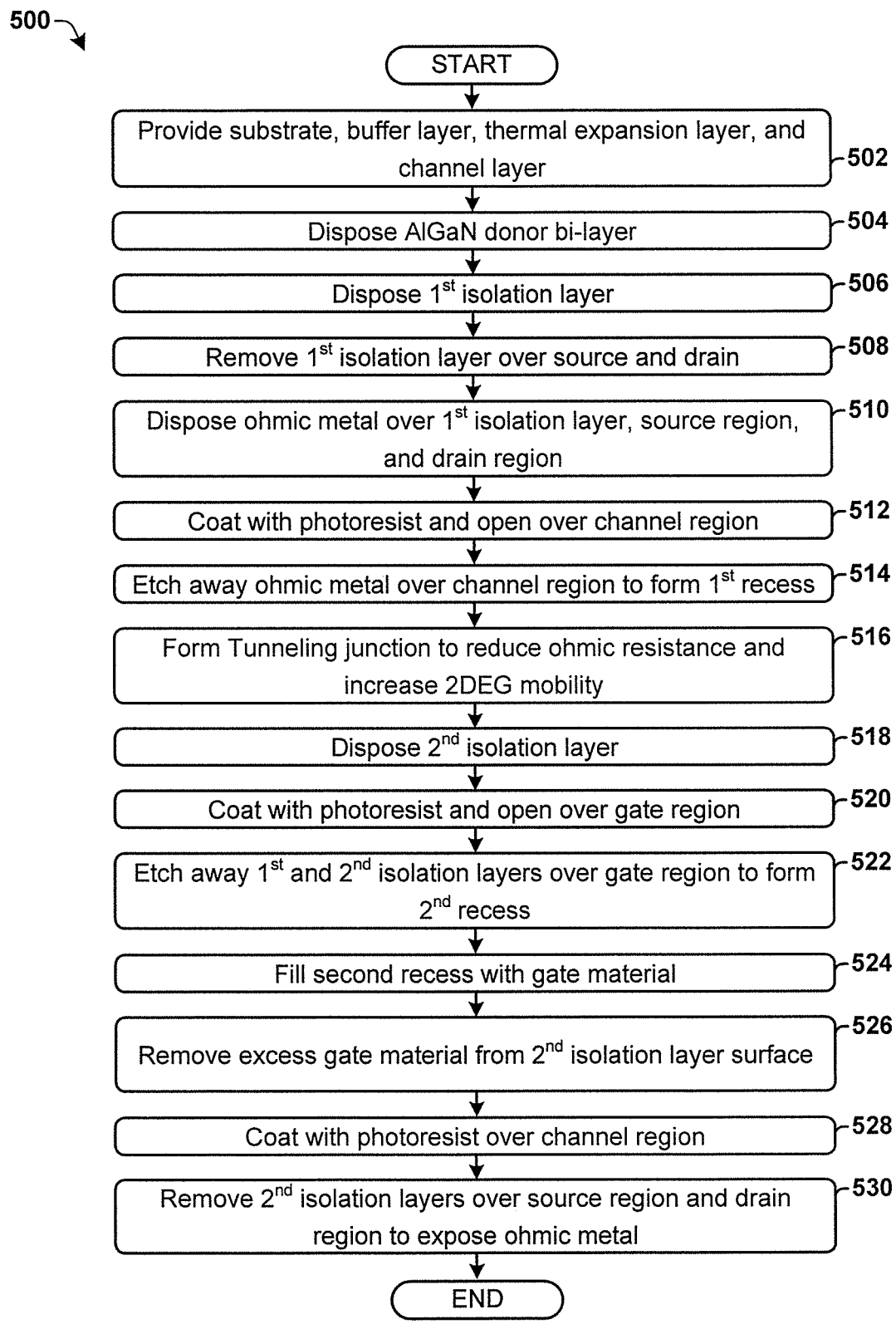
FIG. 5 illustrates some embodiments of a method to form a HEMT comprising a donor layer of bi-layer AlGaN.

FIGS. 4-5 illustrate some embodiments of methods 400 and 500 to form a donor layer of bi-layer AlGaN and a transistor comprising the donor layer of bi-layer AlGaN, respectively. While methods 400 and 500 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein.

In addition, not all illustrated acts may be required to implement one or more aspects or embodiments of the description herein. Further, one or more of the acts depicted herein may be carried out in one or more separate acts and/or phases.

FIG. 4 illustrates some embodiments of a method 400 to form a donor layer of bi-layer AlGaN.

At 402 a mobility-enhancing layer of $Al_zGa_{(1-z)}N$ is disposed over a substrate, wherein a third molar fraction z is less than approximately 0.4 and greater than approximately 0.25. In some embodiments, disposal of the mobility-enhancing layer comprises metal organic chemical vapor deposition (MOCVD) or molecular beam epitaxy (MBE).

At 404 a resistance-reducing layer of $Al_xGa_{(1-x)}N$ is disposed over the mobility-enhancing layer, wherein a first molar fraction x is less than approximately 0.15 and greater than approximately 0.1. In some embodiments, disposal of the resistance-reducing layer comprises MOCVD or MBE.

At 406 a source ohmic contact is disposed to connect to the resistance-reducing layer over a source region and a drain ohmic contact is disposed to connect to the resistance-reducing layer over a drain region. In some embodiments, disposal of the source ohmic metal contact and the drain ohmic metal contact comprises sputtering, a thermal coating technique, an electron-bean (e-beam) evaporation of Ti/Al/Ti or Ti/Al/Ti/TiN. A source tunneling junction results at a first interface between the resistance-reducing and the source ohmic metal contact and a drain tunneling junction results at a second interface between the resistance-reducing and the drain ohmic metal contact.

At 408 an isolation layer is disposed over the resistance-reducing layer over a channel region residing between the source region and the drain region. In some embodiments, disposal of the isolation layer comprises low pressure chemical vapor deposition (LPCVD) or plasma enhanced chemical vapor deposition (PECVD).

At 410 a gate material is disposed within the isolation layer over the channel region and contacting the resistance-reducing layer. In some embodiments the gate material comprises TiN or WN. In some embodiments the gate material is disposed with a gate-first or metal inserted poly-silicon (MIPS) fabrication process. In some embodiments the gate material is disposed with a gate-last, or replacement metal gate (RMG) fabrication process.

FIG. 5 illustrates some embodiments of a method 500 to form a HEMT comprising a donor layer of bi-layer AlGaN. Note that the method 500 follows the fabrication flow illustrated in the embodiments of FIGS. 3A-3O.

At 502 a semiconductor workpiece is provided, the semiconductor workpiece comprising a Si substrate, a buffer layer of AlN configured to lattice match the Si substrate, a thermal expansion layer of $Al_yGa_{(1-y)}N$ configured with a low coefficient of thermal expansion to achieve structural stability across a range of temperatures, and a channel layer of GaN configured to shield the aforementioned layers from damage due to biasing of a gate. Layers of the semiconductor workpiece are disposed on the Si substrate through MOCVD or MBE.

At 504 a donor layer of bi-layer AlGaN is disposed on the semiconductor workpiece through MOCVD or MBE. The donor layer of bi-layer AlGaN comprises a mobility-enhancing layer of $Al_zGa_{(1-z)}N$ disposed over the channel layer, wherein a third molar fraction z is less than approximately 0.4 and greater than approximately 0.25, and a resistance-reducing layer of $Al_xGa_{(1-x)}N$ disposed over the mobility-enhancing layer, wherein a first molar fraction x is less than approximately 0.15 and greater than approximately 0.1.

At 506 a first isolation layer comprising $SiN_x$ or $SiO_2$, wherein x is the first molar fraction, is disposed above the resistance-reducing layer through LPVCD or PECVD.

At 508 portions of the first isolation layer are removed above a source region and a drain region through a photomask patterning process comprising optical lithography and subsequent etch step (e.g., a wet etch, dry etch, chemical etch, plasma etch, a combination thereof, etc.).

At 510 an ohmic metallization layer is disposed above the first isolation layer, source region, and drain region through sputtering, a thermal coating technique, an e-beam evaporator, etc.

At 512 a first layer of photoresist is disposed above the ohmic metallization layer through a spin-coating technique. The first layer of photoresist is exposed and developed through optical lithography to create a first opening the first layer of photoresist above a channel region of the HEMT.

At 514 the ohmic metallization layer is etched away beneath the first opening to create a first recess within the ohmic metallization layer. In some embodiments, etching of the ohmic metallization layer comprises a dry etch.

At 516 electrons tunnel from the ohmic metallization layer into the donor layer of bi-layer AlGaN through a source/drain tunneling junctions 312A between the ohmic metallization layer and a source/drain regions. Electrons within the donor layer of bi-layer AlGaN also diffuse into the channel layer, and accumulate to form the 2DEG which acts as the channel of the HEMT.

At 518 a second isolation layer is disposed above the first isolation layer and the ohmic metallization layer. The second isolation layer also comprises $SiN_x$ or $SiO_2$, wherein x is the first molar fraction, and is disposed through LPVCD or PECVD.

At 520 a second layer of photoresist is spin-coated above the second isolation layer, and exposed and developed through optical lithography to create an second opening in the second layer of photoresist.

At 522 portions of the second isolation layer and the first isolation layer are etched away beneath the second opening to create a second recess over the channel region of the HEMT.

At 524 the second recess is been filled with a gate material which extends over a surface of the second isolation layer. In some embodiments the gate material is disposed with a metal inserted poly-silicon (MIPS) fabrication process. In some embodiments the gate material is disposed with a replacement metal gate (RMG) fabrication process.

At 526 excess gate material is removed over the surface of the second isolation layer through a chemical-mechanical polish (CMP) or a photomask patterning process comprising optical lithography and subsequent etch step (e.g., a wet etch, dry etch, chemical etch, plasma etch, a combination thereof, etc.).

At 528 a third layer of photoresist is spin-coated above the HEMT, patterned, exposed, and developed through optical lithography to remove the third layer of photoresist above the source/drain regions of the HEMT.

At 530 the portions of the second isolation layer are etched away above the source/drain regions to allow for a contact to the source/drain regions through the ohmic metallization layer, resulting in the HEMT transistor 200A of FIG. 2A.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a donor layer of bi-layer AlGaN and associated method of fabrication within a high electron mobility transistor (HEMT) configured to provide low-resistance ohmic source and drain contacts to reduce power consumption, while maintaining a high-mobility of a two-dimensional electron gas (2DEG) within a channel of the HEMT. The donor layer of bi-layer AlGaN comprises a mobility-enhancing layer of $Al_zGa_{(1-z)}N$, a resistance-reducing layer of $Al_xGa_{(1-x)}N$ disposed over the mobility-enhancing layer, wherein the ohmic source and drain contacts connect to the HEMT. A channel layer of GaN is disposed beneath the mobility-enhancing layer, wherein a 2DEG resides, forming the channel of the HEMT.

What is claimed is:

1. A high electron mobility transistor (HEMT), comprising:
   a channel layer disposed over a silicon substrate;
   a donor bi-layer disposed on and abutting the channel layer, the donor bi-layer comprising:
      a mobility-enhancing layer of $Al_zGa_{(1-z)}N$ disposed on and abutting the channel layer and having a molar fraction z in a first range;
      a resistance-reducing layer of $Al_xGa_{(1-x)}N$ disposed on and abutting the mobility-enhancing layer and having a first molar fraction x in a second range less than the first range, wherein the mobility-enhancing layer of $Al_zGa_{(1-z)}N$ has a first thickness value that is approximately twice a second thickness value of the resistance-reducing layer of $Al_xGa_{(1-x)}N$; and
   source and drain ohmic contacts, which contact the resistance-reducing layer of $Al_xGa_{(1-x)}N$;
   a first dielectric isolation layer continually contacting an upper surface of the resistance-reducing layer of $Al_xGa_{(1-x)}N$ from a first position contacting the source ohmic contact to a second position contacting a gate structure contacting the resistance-reducing layer of $Al_xGa_{(1-x)}N$; and
   wherein the donor bi-layer has a conduction band energy that monotonically decreases from the source and drain ohmic contacts to the channel layer.

2. The HEMT of claim 1, wherein the gate structure is arranged at a position laterally between and vertically overlapping the source and drain ohmic contacts.

3. The HEMT of claim 1, wherein the channel layer comprises GaN.

4. The HEMT of claim 1, wherein the first dielectric isolation layer extends below portions of lower surfaces of the source and drain ohmic contacts.

5. The HEMT of claim 4, further comprising a second dielectric isolation layer arranged on and abutting the first dielectric isolation layer and between the source and drain ohmic contacts.

6. The HEMT of claim 5, wherein the first and second dielectric isolation layers comprise oxides, nitrides, or combinations thereof.

7. The HEMT of claim 1,
   wherein the mobility-enhancing layer has a uniform molar fraction of $Al_zGa_{(1-z)}N$; and
   wherein the resistance-reducing layer has a uniform molar fraction of $Al_xGa_{(1-x)}N$.

8. The HEMT of claim 1,
   wherein the mobility-enhancing layer extends continuously between the source and drain ohmic contacts; and
   wherein the resistance-reducing layer extends continuously between the source and drain ohmic contacts.

9. The HEMT of claim 1,
   wherein the first range of the molar fraction z is less than approximately 0.4 and greater than approximately 0.25; and
   wherein the second range of the first molar fraction x is less than approximately 0.15 and greater than approximately 0.1.

10. The HEMT of claim 1, further comprising:
    an aluminum nitride (AlN) buffer layer having a lower surface in direct contact with the silicon substrate; and
    an AlGaN thermal expansion layer having a lower surface in direct contact with the AlN buffer layer and having an upper surface in direct contact with the channel layer, wherein the channel layer is gallium nitride (GaN).

11. The HEMT of claim 1, wherein the conduction band energy has a curved slope between the source and drain ohmic contacts and the channel layer.

12. The HEMT of claim 1, wherein the conduction band energy is a non-piecewise function extending between the source and drain ohmic contacts and the channel layer.

13. A transistor, comprising:
    a channel layer of GaN disposed over a substrate;
    a donor bi-layer of AlGaN contacting the channel layer of GaN, and comprising:
       a mobility-enhancing layer of $Al_zGa_{(1-z)}N$ disposed over the channel layer of GaN, wherein a third molar fraction z is less than approximately 0.4 and greater than approximately 0.25; and
       a resistance-reducing layer of $Al_xGa_{(1-x)}N$ disposed over the mobility-enhancing layer, wherein a first molar fraction x is less than approximately 0.15 and greater than approximately 0.1;
    a source ohmic contact, which contacts the resistance-reducing layer;
    a drain ohmic contact, which contacts the resistance-reducing layer;
    a gate structure, which contacts the resistance-reducing layer over a channel region of the donor bi-layer; and
    wherein the donor bi-layer has a conduction band energy that monotonically decreases from the source and drain ohmic contacts to the channel layer of GaN.

14. The transistor of claim 13, further comprising an isolation structure disposed over the resistance-reducing layer, the isolation structure comprising:
    a first dielectric isolation layer arranged continually contacting the resistance-reducing layer of $Al_xGa_{(1-x)}N$ from a first position contacting the source ohmic contact to a second position contacting the gate structure, wherein an upper surface of the first isolation layer abuts a lower surface of the source and drain ohmic contacts; and
    a second dielectric isolation layer arranged on and abutting the first isolation layer and between the source and drain ohmic contacts.

15. The transistor of claim 13, further comprising:
a thermal expansion layer of $Al_yGa_{(1-y)}N$ disposed beneath the channel layer of GaN, wherein a second molar fraction y is less than approximately 1 and greater than approximately 0; and
a buffer layer of AlN disposed beneath the thermal expansion layer and above the substrate.

16. A method to form a high electron mobility transistor (HEMT), comprising:
forming a III-V compound channel layer over a substrate;
forming a donor bi-layer contacting the III-V compound channel layer, wherein forming the donor bi-layer comprises:
forming a mobility-enhancing layer of $Al_zGa_{(1-z)}N$ on and abutting the III-V compound channel layer, wherein a third molar fraction z is less than approximately 0.4 and greater than approximately 0.25;
forming a resistance-reducing layer of $Al_xGa_{(1-x)}N$ on and abutting the mobility-enhancing layer, wherein a first molar fraction x is less than approximately 0.15 and greater than approximately 0.1;
forming a source ohmic metal contact, which contacts the resistance-reducing layer;
forming a drain ohmic metal contact, which contacts the resistance-reducing layer;
forming a gate material, which contacts the resistance-reducing layer over a channel region of the HEMT; and
wherein the donor bi-layer has a conduction band enemy that monotonically decreases from the source and drain ohmic contacts to the III-V compound channel layer.

17. The method of claim 16, wherein the channel layer comprises GaN.

18. The method of claim 17, further comprising:
disposing a first dielectric isolation layer over the resistance-reducing layer of $Al_xGa_{(1-x)}N$;
disposing source and drain ohmic contacts, which abut an upper surface of the first dielectric isolation layer and an upper surface of the resistance-reducing layer; and
disposing a second dielectric isolation layer on the first dielectric isolation layer.

19. The method of claim 18, wherein the mobility-enhancing layer comprises a first thickness value that is approximately twice a second thickness value of the resistance-reducing layer.

20. The method of claim 18, wherein the mobility-enhancing layer or resistance-reducing layer is disposed though metal organic chemical vapor deposition or molecular beam epitaxy.

\* \* \* \* \*